United States Patent [19]

Dorri et al.

[11] Patent Number: 5,594,401
[45] Date of Patent: Jan. 14, 1997

[54] CLOSED SUPERCONDUCTIVE MAGNET WITH UNIFORM IMAGING VOLUME

[75] Inventors: Bizhan Dorri, Clifton Park; Evangelos T. Laskaris, Schenectady; Michele D. Ogle, Burnt Hills, all of N.Y.

[73] Assignee: General Electric Company, Schenectady, N.Y.

[21] Appl. No.: 603,521

[22] Filed: Feb. 20, 1996

[51] Int. Cl.$^6$ .................................. H01F 6/00; G01V 3/00
[52] U.S. Cl. ................................................ 335/216; 324/319
[58] Field of Search ................................. 335/216, 296, 335/299, 301; 324/318, 319, 320

[56] References Cited

U.S. PATENT DOCUMENTS

| | | | |
|---|---|---|---|
| 4,698,611 | 10/1987 | Vermilyea | 335/298 |
| 4,710,741 | 12/1987 | McGinley | 335/296 |
| 4,771,243 | 9/1988 | Vreugdenhil et al. | 324/320 |
| 4,890,082 | 12/1989 | Fujita | 335/301 |
| 4,924,198 | 5/1990 | Laskaris | 335/216 |
| 5,001,447 | 3/1991 | Jayakumar et al. | 335/299 |
| 5,291,169 | 3/1994 | Ige et al. | 335/216 |
| 5,343,183 | 8/1994 | Shimada et al. | 335/301 |
| 5,389,909 | 2/1995 | Havens | 335/216 |
| 5,396,208 | 3/1995 | Overweg et al. | 335/301 |
| 5,410,287 | 4/1995 | Laskaris et al. | 335/216 |
| 5,463,364 | 10/1995 | Muller | 335/216 |

OTHER PUBLICATIONS

Pending U.S. patent application Ser. No. 08/373,996, filed Oct. 17, 1995, buy Bizhan Dorri, entitled "Method for Passively Shimming a Magnet".
Concurrently filed U.S. patent application RD–24846, by Bizhan Dorri et al, entitled "Closed Superconductive Magnet with Homogeneous Imaging Volume", Ser. No. 08/603520.
Concurrently filed U.S. patent application RD–24845, by Bizhan Dorri et al, entitled "Closed MRI Magnet Having Reduced Length", Ser. No. 08/603522.
Pending U.S. patent application Ser. No. 08/457,085, filed Oct. 23, 1995, by Bizhan Dorri et al., entitled "Cryogenic-Fluid-Cooled Open MRI Magnet with Uniform Magnetic Field".
Pending U.S. patent application Ser. No. 08/547,002, filed Oct. 23, 1995, by Bizhan Dorri et al., entitled "Open MRI Magnet with Homogeneous Imaging Volume".
Pending U.S. patent application Ser. No. 08/553,734, filed Oct. 23, 1995, by E. T. Laskaris et al., entitled "Open MRI Magnet with Uniform Imaging Volume".
Pending U.S. patent application Ser. No. 08/509,565, filed Jul. 31, 1995, by T. Havens et al., entitled "Open Architecture Magnetic Resonance Imaging Superconducting Magnet Assembly".
Pending U.S. patent application Ser. No. 08/547,083, filed Oct. 23, 1995, by Bizhan Dorri et al., entitled "Shielded and Open MRI Magnet".
Pending U.S. patent application Ser. No. 08/373,995, filed Oct. 17, 1995, by Bizhan Dorri, entitled "Method for Passively Shimming an Open Magnet".

*Primary Examiner*—Michael L. Gellner
*Assistant Examiner*—Raymond M. Barrera
*Attorney, Agent, or Firm*—Douglas E. Erickson; Marvin Snyder

[57] ABSTRACT

A closed magnetic resonance imaging (MRI) magnet has a single superconductive coil assembly including a toroidal-shaped coil housing containing a pair of superconductive main coils and at least one additional superconductive main coil. A pair of generally-non-permanently-magnetized ferromagnetic rings is spaced radially inward and apart from the superconductive main coils. The ferromagnetic rings allow the design of a shorter MRI magnet because the ferromagnetic rings overcome the gross magnetic field distortions in the imaging volume of the magnet (created by removing some of the additional longitudinally-outermost superconductive main coils, otherwise used in the magnet, to make the magnet shorter) to produce a magnetic field of high uniformity within the imaging volume.

9 Claims, 3 Drawing Sheets

CLOSED SUPERCONDUCTIVE MAGNET WITH UNIFORM IMAGING VOLUME

BACKGROUND OF THE INVENTION

The present invention relates generally to a superconductive magnet (such as, but not limited to, a helium-cooled and/or cryocooler-cooled superconductive magnet) used to generate a high magnetic field as part of a magnetic resonance imaging (MRI) system, and more particularly to such a magnet having a closed design and having a homogeneous (i.e., uniform) magnetic field within its imaging volume.

MRI systems employing superconductive or other type magnets are used in various fields such as medical diagnostics. Known superconductive magnets include liquid-helium cooled and cryocooler-cooled superconductive magnets. Typically, for a helium-cooled magnet, the superconductive coil assembly includes a superconductive main coil which is at least partially immersed in liquid helium contained in a helium dewar which is surrounded by a dual thermal shield which is surrounded by a vacuum enclosure. In a conventional cryocooler-cooled magnet, the superconductive main coil is surrounded by a thermal shield which is surrounded by a vacuum enclosure, and the cryocooler coldhead is externally mounted to the vacuum enclosure with the coldhead's first stage in thermal contact with the thermal shield and with the coldhead's second stage in thermal contact with the superconductive main coil. Nb-Ti superconductive coils typically operate at a temperature of generally 4 Kelvin, and Nb-Sn superconductive coils typically operate at a temperature of generally 10 Kelvin.

Known superconductive magnet designs include closed magnets and open magnets. Closed magnets typically have a single, tubular-shaped superconductive coil assembly having a bore. The superconductive coil assembly includes several radially-aligned and longitudinally spaced-apart superconductive main coils each carrying a large, identical electric current in the same direction. The superconductive main coils are thus designed to create a magnetic field of high uniformity within a spherical imaging volume centered within the magnet's bore where the object to be imaged is placed. Although the magnet is so designed to have a highly uniform magnetic field within the imaging volume, manufacturing tolerances in the magnet and magnetic field disturbances caused by the environment at the field site of the magnet usually require that the magnet be corrected at the field site for such minor irregularities in the magnetic field. Typically, the magnet is shimmed at the field site by using pieces of iron, or, for Nb-Ti superconductive magnets cooled by liquid helium, by using numerous Nb-Ti superconductive correction coils. The correction coils are placed within the superconductive coil assembly radially near and radially inward of the main coils. Each correction coil carries a different, but low, electric current in any required direction including a direction opposite to the direction of the electric current carried in the main coils. Closed MRI magnets tend to have a relatively long axial (i.e., longitudinal) length to accommodate the number of main superconductive coils needed to achieve a homogeneous imaging volume which, especially in the case of whole-body magnets, tends to create claustrophobic feelings in patients.

Open magnets typically employ two spaced-apart superconductive coil assemblies with the space between the assemblies allowing for access by medical personnel for surgery or other medical procedures during MRI imaging. The patient may be positioned in that space or also in the bore of the toroidal-shaped coil assemblies. The open space helps the patient overcome any feelings of claustrophobia that may be experienced in a closed magnet design. The literature is largely silent on how superconductive open magnets can be made to have a magnetic field of high uniformity within the imaging volume when the creation of the open space between the superconductive coil assemblies grossly distorts the magnetic field creating a magnetic field of low uniformity within the imaging volume. Such magnetic field distortion is well beyond that which can be overcome by using known magnet shimming technology. Also, such open magnets are more expensive than closed magnets for the same strength magnetic field within the imaging volume.

What is needed is a closed MRI magnet which is designed to have a relatively short axial (i.e., longitudinal) length to overcome claustrophobic feelings of patients and to provide at least some patient access by physicians and which is designed to have a highly uniform magnetic field within its imaging volume to provide for sharp medical images.

SUMMARY OF THE INVENTION

It is an object of the invention to provide a closed superconductive MRI magnet.

The closed MRI magnet of the invention has a single superconductive coil assembly including a generally toroidal-shaped coil housing surrounding a bore and having a generally longitudinally-extending axis. The single superconductive coil assembly also includes a pair of longitudinally-spaced-apart, generally identical, and generally annular-shaped superconductive main coils each generally coaxially aligned with the axis, each located within the coil housing, and each having a longitudinally-outermost portion. The single superconductive coil assembly additionally includes a pair of longitudinally-spaced-apart, generally identical, and generally-non-permanently-magnetized ferromagnetic rings each generally coaxially aligned with the axis, each radially positioned inward and apart from the pair of superconductive main coils, and each longitudinally positioned completely between the longitudinally-outermost portions of the pair of superconductive main coils. The single superconductive coil assembly further includes at least one generally annular-shaped additional superconductive main coil generally coaxially aligned with the axis, having a magnetic-field direction within the bore generally identical to the first magnetic-field direction, and positioned within the coil housing and longitudinally between the pair of ferromagnetic rings. In a preferred embodiment, the pair of ferromagnetic rings each is longitudinally positioned a generally identical distance from a plane which is oriented perpendicular to the axis and which is located longitudinally midway between the pair of superconductive main coils. In an exemplary embodiment, the coil housing has spaced-apart longitudinally-outermost ends, and the bore has a radius which increases as one moves longitudinally outward from the pair of ferromagnetic rings to the longitudinally-outermost ends of the coil housing.

Several benefits and advantages are derived from the invention. With Applicant's closed MRI magnet design, the overall axial (i.e., longitudinal) length of, for example, a whole-body magnet may be shortened by using magnetic field analysis to choose the ferromagnetic rings to overcome the gross magnetic field distortions within the imaging volume (created by removing some, or all, of the additional longitudinally-outermost superconductive main coils removed to shorten the magnet) to produce a magnetic field of high uniformity within the imaging volume. Applicant's highly uniform magnetic field permits high quality MRI imaging. Applicant's shorter closed magnet design eliminates or reduces any claustrophobic feelings of patients. Applicant's design of a coil housing whose bore opens wider at its ends further reduces any feelings of claustrophobia.

BRIEF DESCRIPTION OF THE DRAWINGS

The accompanying drawings illustrate two preferred embodiments of the present invention wherein.

DETAILED DESCRIPTION OF THE INVENTION

Figure 1:
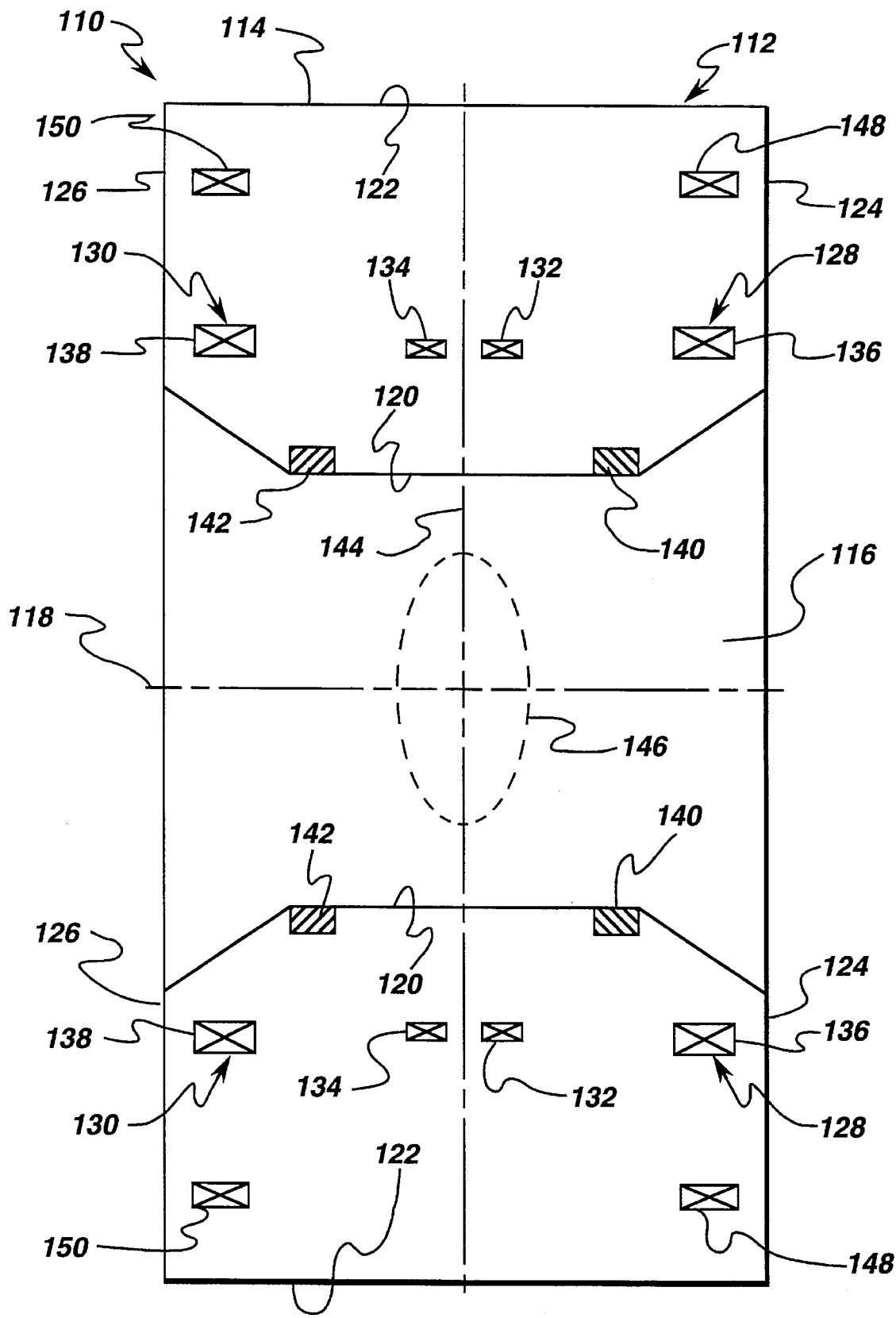
FIG. 1 is a schematic cross-sectional side-elevational view of a first preferred embodiment of the closed MRI magnet of the invention having internal ferromagnetic rings.

Referring now to the drawings, wherein like numerals represent like elements throughout, FIG. 1 shows a first preferred embodiment of the closed magnetic-resonance-imaging (MRI) magnet 110 of the present invention. The magnet 110 has a single superconductive coil assembly 112. The single superconductive coil assembly 112 includes a generally toroidal-shaped coil housing 114 surrounding a bore 116 and having a generally longitudinally-extending axis 118. The coil housing 114 includes a first generally-circumferential outside surface 120 facing generally towards the axis 118 and a second generally-circumferential outside surface 122 radially spaced apart from the first circumferential outside surface 120 and facing generally away from the axis 118. The coil housing 114 also includes spaced-apart longitudinally-outermost ends 124 and 126. Each of the longitudinally-outermost ends 124 and 126 preferably is a generally-annular outside surface. Typically, the coil housing 114 defines a vacuum enclosure.

The single superconductive coil assembly 112 also includes a pair of longitudinally-spaced-apart, generally identical, and generally annular-shaped superconductive main coils 128 and 130 and further includes at least one generally annular-shaped additional superconductive main coil (only one additional pair 132 and 134 of which is shown in FIG. 1) which typically is not generally identical to the pair of superconductive main coils 128 and 130. The additional superconductive main coils are be needed to achieve a high magnetic field strength, within the magnet's imaging volume, without exceeding the critical current density of the superconductor being used in the coils, as is known to those skilled in the art. Each of the pair of superconductive main coils 128 and 130 (and each of the additional superconductive main coils such as the one additional pair 132 and 134) is conventionally supported on a coil form (not shown in the figures). Each of the pair of superconductive main coils 128 and 130 (and each of the additional superconductive main coils) is generally coaxially aligned with the axis 118, is disposed within the coil housing 114, and carries a generally identical main electric current in a same first electric-current direction. The first electric-current direction is defined to be either a clockwise or a counterclockwise circumferential direction about the axis 118 with any slight longitudinal component of current direction being ignored. Hence, each of the pair of superconductive main coils 128 and 130 (and each of the additional superconductive main coils) has a generally identical first magnetic-field direction within the bore 116 which is generally parallel to the axis 118. Preferably, the pair of superconductive main coils 128 and 130 is a longitudinally-outermost (i.e., longitudinally-furthest-apart) pair of superconductive main coils. The superconductor used in each of the superconductive main coils 128, 130, 132, or 134 typically would be a superconductive wire or superconductive tape wound such that each superconductive main coil 128, 130, 132, or 134 has a longitudinal extension and a radial extension (i.e., radial thickness) far greater than the corresponding dimensions of the superconductive wire or superconductive tape. Each of the pair of superconductive main coils 128 and 130 has a longitudinally-outermost portion 136 and 138.

The single superconductive coil assembly 112 additionally includes a pair of longitudinally-spaced-apart, generally identical, and generally-non-permanently-magnetized ferromagnetic rings 140 and 142. It is noted that the at least one additional superconductive main coil 132 and 134 is disposed longitudinally between the pair of ferromagnetic rings 140 and 142. Each of the pair of ferromagnetic rings 140 and 142 is generally coaxially aligned with the axis 118, radially disposed inward and apart from the pair of superconductive main coils 128 and 130, and longitudinally disposed completely between the longitudinally-outermost portions 136 and 138 of the pair of superconductive main coils 128 and 130. Each of the pair of ferromagnetic rings 140 and 142 may be a circumferentially-continuous ring, an array of circumferentially-abutting ring segments, or an array of spaced-apart, circumferentially-adjacent ring segments wherein the length of the arc of any circumferential space between circumferentially-adjacent ring segments is always smaller than the arc length of any ring segment making up the array. In the first preferred embodiment, as shown in FIG. 1, the pair of ferromagnetic rings 140 and 142 is disposed within the coil housing 114 proximate the first circumferential outside surface 120. In an exemplary construction, the pair of ferromagnetic rings 140 and 142 consists essentially of (and preferably consists of) carbon steel. Preferably, the pair of ferromagnetic rings 140 and 142 each is longitudinally disposed a generally identical distance from a plane 144 which is oriented perpendicular to the axis 118 and which is disposed longitudinally midway between the pair of superconductive main coils 128 and 130.

It is preferred that the longitudinally-outermost ends 124 and 126 of the coil housing 114 are longitudinally disposed a generally identical distance from the plane 144. It is noted that such longitudinally-outermost ends 124 and 126 desirably are generally-annular outside surfaces facing generally away from (and preferably aligned parallel with) the plane 144. The first circumferential outside surface 120 defines the radial extent of the bore 116 of the coil housing 114. In an exemplary construction, the bore 116 has a radius which increases as one moves longitudinally outward from the pair of ferromagnetic rings 140 and 142 to the longitudinally-outermost ends 124 and 126 of the coil housing 114. This reduces claustrophobic feelings in patients who are placed in the bore 116 of whole-body MRI magnets. Preferably, the radius of the bore 116 is generally constant as one moves longitudinally across the pair of ferromagnetic rings 140 and 142, and the radius of the bore 116 is generally constant as one moves longitudinally between the pair of ferromagnetic rings 140 and 142. In FIG. 1, the radius of the bore 116 is generally identical longitudinally across and between the pair of ferromagnetic rings 140 and 142.

The pair of superconductive main coils 128 and 130 (together with the additional main coils such as the additional pair of superconductive main coils 132 and 134) typically produce, as designed by the artisan, a generally spherical, generally ellipsoidal (as shown in FIG. 1), generally cylindrical, or other-shaped imaging volume 146 (shown as a dotted image in FIG. 1) typically centered generally at the intersection of the plane 144 and the axis 118. A closed MRI magnet which is designed to have a relatively short axial (i.e., longitudinal) length to overcome claustrophobic feelings of patients must remove some longitudinally-outermost superconductive main coils to achieve its short length. The effect of the removed coils is to distort the uniformity of the magnetic field of the imaging volume 146. As one moves longitudinally through the imaging volume 146, the magnitude of the magnetic field decreases with decreasing distance from the center of the imaging volume 146 because of the missing longitudinally-outermost superconductive main coils which were removed to shorten the length of the magnet 110. The effect of the pair of ferromagnetic rings 140 and 142 is to lower the magnitude of the magnetic field toward the longitudinal edges of the imaging volume 146 in line with the lower magnitude at the center. The pair of ferromagnetic rings 140 and 142 is designed, using the principles of the present invention, previously disclosed herein, together with conventional magnetic field analysis, as is within the skill of the artisan, to produce a highly homogeneous magnetic field within the imaging volume 146 for improved MRI imaging. Preferably, superconductive shielding coils 148 and 150 also are employed which carry a shielding electric current in a direction opposite to the first electric-current direction, as can be appreciated by those skilled in the art.

Figure 2:
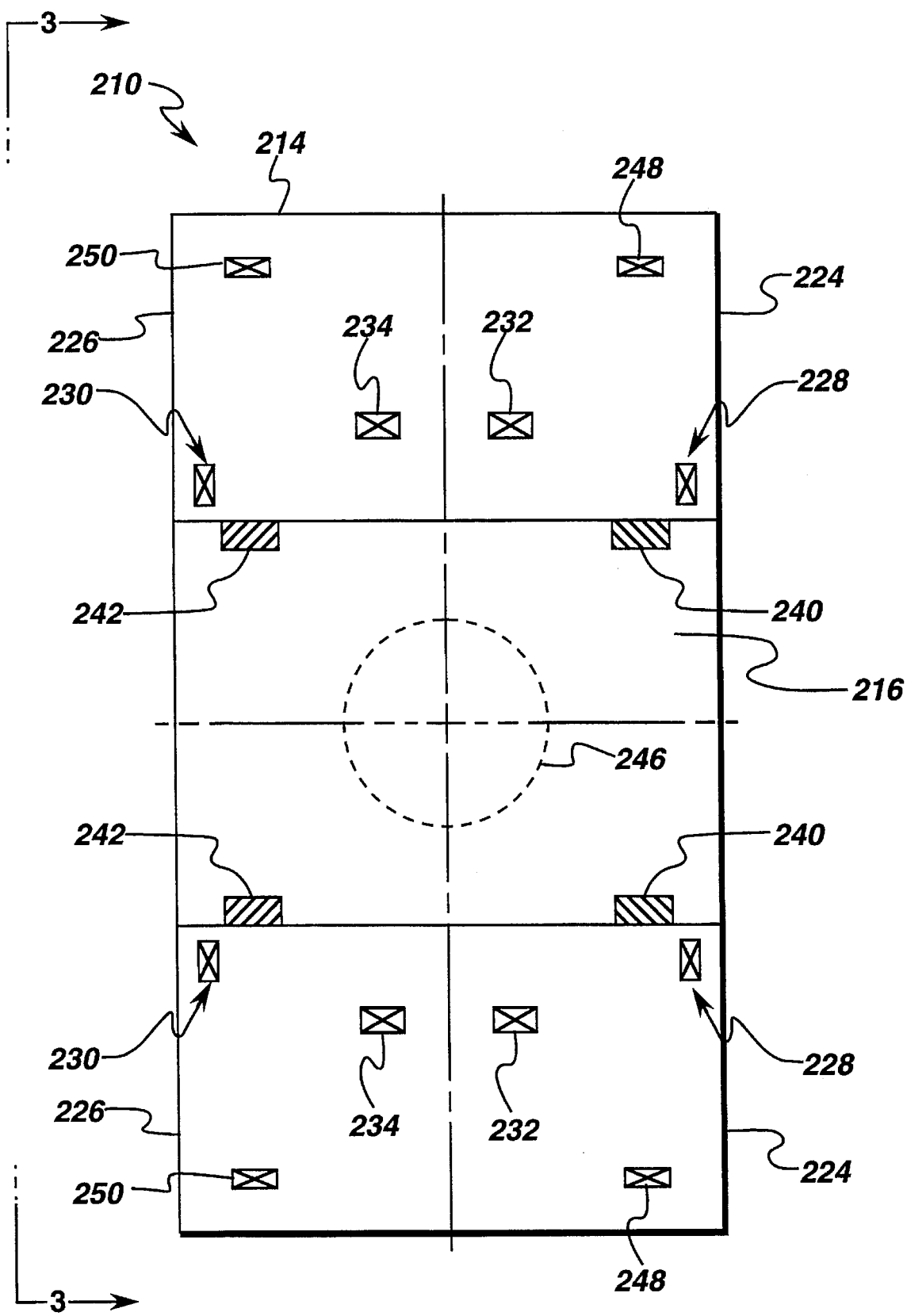
FIG. 2 is a view, as in FIG. 1, but of a second preferred embodiment of the closed MRI magnet of the invention having external ferromagnetic rings.
Figure 3:
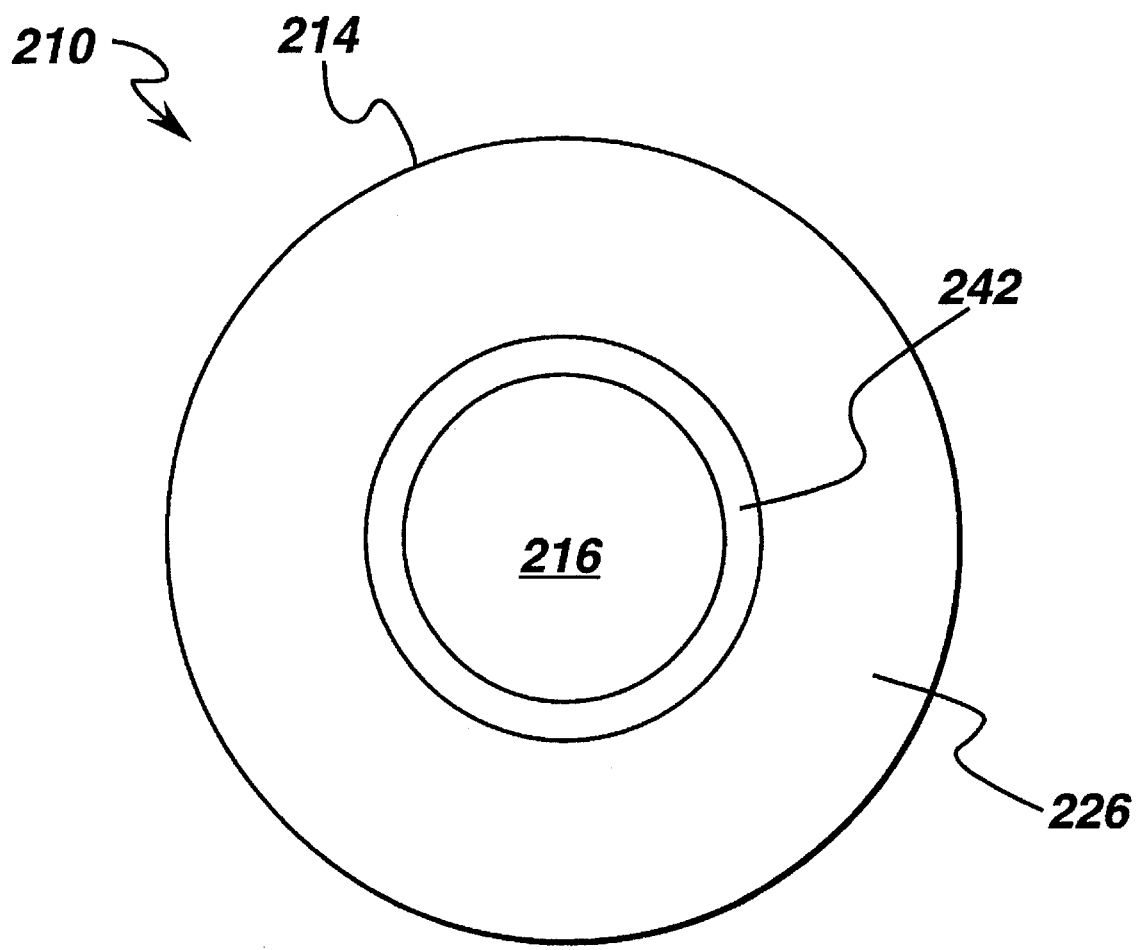
FIG. 3 is a schematic end view of the MRI magnet of FIG. 2 taken along the lines 3—3 of FIG. 2.

Referring again to the drawings, FIGS. 2–3 show a second preferred embodiment of the closed magnetic resonance imaging (MRI) magnet 210 of the present invention. Magnet 210 is similar to magnet 110 of the first preferred embodiment of the invention, with differences as hereinafter noted. The bore 216 has a generally constant radius as one moves longitudinally between the longitudinally-outermost ends 224 and 226 of the coil housing 214. The pair of superconductive main coils 228 and 230 (together with the additional main coils such as the additional pair of superconductive main coils 232 and 234) have been designed to produce a generally spherical imaging volume 246, as is within the skill of the artisan. The pair of ferromagnetic rings 240 and 242 is disposed outside (and not within) the coil housing 214 in the bore 216. Preferably, as shown in FIG. 2, the pair of ferromagnetic rings 240 and 242 is attached to the coil housing 214. It is noted that in a preferred construction the pair of generally identical ferromagnetic rings 240 and 242 comprises a pair of circumferentially-continuous rings wherein the circumferentially-continuous nature of ferromagnetic ring 242 is shown in FIG. 3. It is pointed out that ferromagnetic ring 240 is generally identical to ferromagnetic ring 242. In magnet 210, as in magnet 110, it is preferred to employ superconductive shielding coils 248 and 250.

Applicants have used computer analysis to verify the magnet-shortening effect of using ferromagnetic rings. In a first example, a one-Tesla, 45-centimeter-diameter, homogeneous spherical imaging volume was achieved with a coil-housing length of generally 120 centimeters with ferromagnetic rings compared to an estimated generally 160 centimeters without ferromagnetic rings. In a second example, a 30-centimeter-axial by 40-centimeter-diameter ellipsoidal imaging volume was achieved with a coil-housing length of generally 100 centimeters with ferromagnetic rings compared to an estimated generally 140 centimeters without ferromagnetic rings. In a third example, a 10-centimeter-axial by 40-centimeter-diameter cylindrical imaging volume was achieved with a coil-housing length of generally 90 centimeters with ferromagnetic rings compared to an estimated generally 130 centimeters without ferromagnetic rings.

It is noted that magnet cooling mechanisms, together with any required thermal shields, do not form a part of the present invention and have been omitted from the figures. Any cryogenic cooling mechanism, such as, but not limited to, liquid helium (or other cryogenic fluid) cooling and/or cryocooler cooling may be employed in combination with the present invention.

The foregoing description of several preferred embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

We claim:

1. A closed magnetic-resonance-imaging magnet comprising a single superconductive coil assembly including:

a) a generally toroidal-shaped coil housing surrounding a bore and having a generally longitudinally-extending axis;

b) a pair of longitudinally-spaced-apart, generally identical, and generally annular-shaped superconductive main coils each generally coaxially aligned with said axis, each carrying an electric current in a same first electric-current direction, each disposed within said coil housing, and each having a longitudinally-outermost portion;

c) a pair of longitudinally-spaced-apart, generally identical, and non-permanently-magnetized ferromagnetic rings each generally coaxially aligned with said axis, each radially disposed inward and apart from said pair of superconductive main coils, and each longitudinally disposed completely between said longitudinally-outermost portions of said pair of superconductive main coils, wherein said pair of ferromagnetic rings are the only ferromagnetic rings included in said single superconductive coil assembly;

d) at least one generally annular-shaped additional superconductive main coil generally coaxially aligned with said axis, carrying an electric current in said first electric-current direction, and disposed within said coil housing and longitudinally between said pair of ferromagnetic rings; and e) superconductive shielding coils carrying an electric current in a direction opposite to said first electric-current direction, radially disposed outward from said pair of superconductive main coils and from said at-least-one additional superconductive main coil, and longitudinally disposed outward from said at-least-one additional superconductive main coil.

2. The magnet of claim 1, wherein said pair of ferromagnetic rings each is longitudinally disposed a generally identical distance from a plane which is oriented perpendicular to said axis and which is disposed longitudinally midway between said pair of superconductive main coils.

3. The magnet of claim 2, wherein said pair of ferromagnetic rings comprises a pair of circumferentially-continuous rings.

4. The magnet of claim 2, wherein said pair of ferromagnetic rings is disposed within said coil housing.

5. The magnet of claim 2, wherein said pair of ferromagnetic rings is disposed outside said coil housing in said bore.

6. The magnet of claim 5, wherein said pair of ferromagnetic rings is attached to said coil housing.

7. The magnet of claim 2, wherein said coil housing has spaced-apart longitudinally-outermost ends and wherein said bore has a radius which increases as one moves longitudinally outward from said pair of ferromagnetic rings to said longitudinally-outermost ends of said coil housing.

8. The magnet of claim 7, wherein said radius of said bore is generally constant as one moves longitudinally across said pair of ferromagnetic rings.

9. The magnet of claim 8, wherein said radius of said bore is generally constant as one moves longitudinally between said pair of ferromagnetic rings.

* * * * *